(12) United States Patent
Sone et al.

(10) Patent No.: US 8,715,520 B2
(45) Date of Patent: May 6, 2014

(54) SUBSTRATE PROCESSING METHOD AND STORAGE MEDIUM

(75) Inventors: Takashi Sone, Miyagi (JP); Eiichi Nishimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 13/425,551

(22) Filed: Mar. 21, 2012

(65) Prior Publication Data

US 2012/0244716 A1 Sep. 27, 2012

Related U.S. Application Data

(60) Provisional application No. 61/472,689, filed on Apr. 7, 2011.

(30) Foreign Application Priority Data

Mar. 22, 2011 (JP) ................................. 2011-062301

(51) Int. Cl.
*C23F 1/40* (2006.01)

(52) U.S. Cl.
USPC ................. 216/75; 216/37; 216/67; 438/689; 438/690; 438/691; 438/692

(58) Field of Classification Search
USPC .......................... 216/37, 67, 75; 438/689–692
See application file for complete search history.

(56) References Cited

U.S. PATENT DOCUMENTS

| | | | |
|---|---|---|---|
| 6,069,035 A | 5/2000 | O'Donnell | |
| 8,334,148 B2 * | 12/2012 | Jeong et al. | 438/3 |
| 2003/0022494 A1 | 1/2003 | Ying | |
| 2008/0286976 A1 * | 11/2008 | Chen et al. | 438/706 |

FOREIGN PATENT DOCUMENTS

| JP | 2006-060172 | * | 3/2006 |
|---|---|---|---|
| JP | 2006-060172 A | | 3/2006 |

OTHER PUBLICATIONS

Koichi, et al., "Dry Etching of High-k Materials", Journal of Plasma Fusion Research, vol. 85, No. 4, pp. 185-192, issued on Jan. 2009.

* cited by examiner

*Primary Examiner* — Duy Deo
*Assistant Examiner* — Maki Angadi
(74) *Attorney, Agent, or Firm* — Pearne & Gordon LLP

(57) ABSTRACT

There is provided a substrate processing method capable of etching a layer containing, at least, platinum without using a halogen gas. When etching the platinum-manganese layer on a wafer W by using a tantalum (Ta) layer 38 having a certain pattern shape, a processing gas containing, at least, a carbon monoxide gas, a hydrogen gas, and a rare gas is used, and a ratio of a gas flow rate of the hydrogen gas to a total gas flow rate of the carbon monoxide gas and the hydrogen gas is in a range of from about 50% to about 75%.

6 Claims, 5 Drawing Sheets

SUBSTRATE PROCESSING METHOD AND STORAGE MEDIUM

CROSS-REFERENCE TO RELATED APPLICATION

This application claims the benefit of Japanese Patent Application No. 2011-062301 filed on Mar. 22, 2011, and U.S. Provisional Application Ser. No. 61/472,689 filed on Apr. 7, 2011, the entire disclosures of which are incorporated herein by reference.

FIELD OF THE INVENTION

The present disclosure relates to a substrate processing method for etching a layer containing, at least, platinum and a storage medium.

BACKGROUND OF THE INVENTION

A magnetic storage device configured to store therein information by using magnetization reversal by magnetic fields of electric currents is manufactured by using a semiconductor wafer (hereinafter, simply referred to as "wafer") in which various layers are layered and etched in a desired shape. One of the various layers of the magnetic storage device is a platinum-manganese (Pt—Mn) layer containing platinum (Pt) as a magnetic material. It is known that platinum is one of materials that are difficult to be etched.

As a method for etching the platinum-manganese layer, there has been known a method for physically etching the platinum-manganese layer by an ion milling process, for example, a sputtering process using argon (Ar) cations of high energy. In the ion milling process, cations are projected to a mask film and to the platinum-manganese layer with high energy. As a result, it is difficult to obtain selectivity between the mask film and the platinum-manganese layer. Further, a pattern shape of the mask film is damaged early, and, thus, a hole or a trench formed by the etching process has a sidewall of a tapering shape (see, for example, Non-Patent Document 1).

Therefore, there has been suggested a method for chemically etching the platinum-manganese layer by an etching gas containing a halogen gas of high reducibility (see, for example, Patent Document 1).

Non-Patent Document 1: "Dry etching of high-k materials" of Ono Koichi, Takahashi Kazuo, and Erikuchi Koji: Journal of Plasma Fusion Research, Vol.85, No. 4 (2009), pp. 185-192, issued on January 2009

Patent Document 1: Japanese Patent Laid-open Publication No. 2006-060172

However, since the halogen gas generates strong acids, there is a problem that corrosion of the magnetic material itself or components of a substrate processing apparatus becomes accelerated.

BRIEF SUMMARY OF THE INVENTION

Illustrative embodiments provide a substrate processing method capable of etching a layer containing, at least, platinum without using a halogen gas and a storage medium.

In view of the foregoing, in accordance with an aspect of the illustrative embodiment, there is provided a substrate processing method for etching a layer, containing, at least, platinum, formed on a substrate by using a mask film. The substrate processing method includes etching the layer containing, at least, platinum by using a processing gas containing, at least, a carbon monoxide gas, a hydrogen gas, and a rare gas. Here, a ratio of a gas flow rate of the hydrogen gas to a total gas flow rate of the carbon monoxide gas and the hydrogen gas is in a range of from about 50% to about 75%.

Further, the ratio of the gas flow rate of the hydrogen gas to the total gas flow rate of the carbon monoxide gas and the hydrogen gas may be in a range of from about 50% to about 60%.

Moreover, a ratio of a gas flow rate of the rare gas to a total gas flow rate of the rare gas and the carbon monoxide gas may be in a range of from about 40% to about 50%.

Furthermore, the rare gas may include an argon gas.

In the substrate processing method, the etching the layer containing, at least, platinum may be performed at a pressure in a range of from about 13.3 Pa (about 100 mTorr) to about 133 Pa (about 1 Torr).

In the substrate processing method, the etching the layer containing, at least, platinum may be performed at a pressure in a range of from about 40.0 Pa (about 300 mTorr) to about 133 Pa (about 1 Torr).

In accordance with another aspect of the illustrative embodiment, there is provided a computer-readable storage medium having stored thereon computer-executable instructions, in response to execution, cause a substrate processing apparatus to perform a substrate processing method for etching a layer containing, at least, platinum and formed on a substrate by using a mask film. The substrate processing method includes etching the layer containing, at least, platinum by using a processing gas containing, at least, a carbon monoxide gas, a hydrogen gas, and a rare gas. Here, a ratio of a gas flow rate of the hydrogen gas to a total gas flow rate of the carbon monoxide gas and the hydrogen gas is in a range of from about 50% to about 75%.

In accordance with an illustrative embodiment, a layer containing, at least, platinum is etched by using a processing gas containing, at least, a carbon monoxide gas, a hydrogen gas, and a rare gas, and a ratio of a gas flow rate of the hydrogen gas to a total gas flow rate of the carbon monoxide gas and the hydrogen gas is in a range of from about 50% to about 75%. If the etching is performed by using the carbon monoxide gas, a carbon layer is deposited on exposed surfaces of various layers. However, this carbon layer is ashed by hydrogen plasma generated from the hydrogen gas. At this time, cations generated from the rare gas are projected to the carbon layer and supply energy to the carbon layer. Further, since the ratio of the gas flow rate of the hydrogen gas to the total gas flow rate of the carbon monoxide gas and the hydrogen gas is in the range of from about 50% to about 75% and a great amount of hydrogen exists, surplus hydrogen remains while the carbon layer is ashed. The carbon layer supplied with energy is reacted with oxygen generated from the carbon monoxide gas, so that a carbonyl group is generated. The surplus hydrogen is combined with the carbonyl group by the energy supplied to the carbon layer, so that a carboxyl group is generated. This carboxyl group as a ligand is coordinate-bonded with the platinum, so that an organic complex is generated. The organic complex is easy to be vaporized, and, thus, it is possible to remove the platinum from the layer containing, at least, platinum. Therefore, it is possible to etch the layer containing, at least, platinum without using a halogen gas.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 4(A) shows a first modification example and FIG. 4(B) shows a second modification example; FIG. 5(A) shows a first modification example, FIG. 5(B) shows a second modification example, FIG. 5(C) shows a third modification example, and FIG. 5(D) shows a fourth modification example.

DETAILED DESCRIPTION OF THE INVENTION

Hereinafter, illustrative embodiments will be described with reference to the accompanying drawings.

Figure 1:
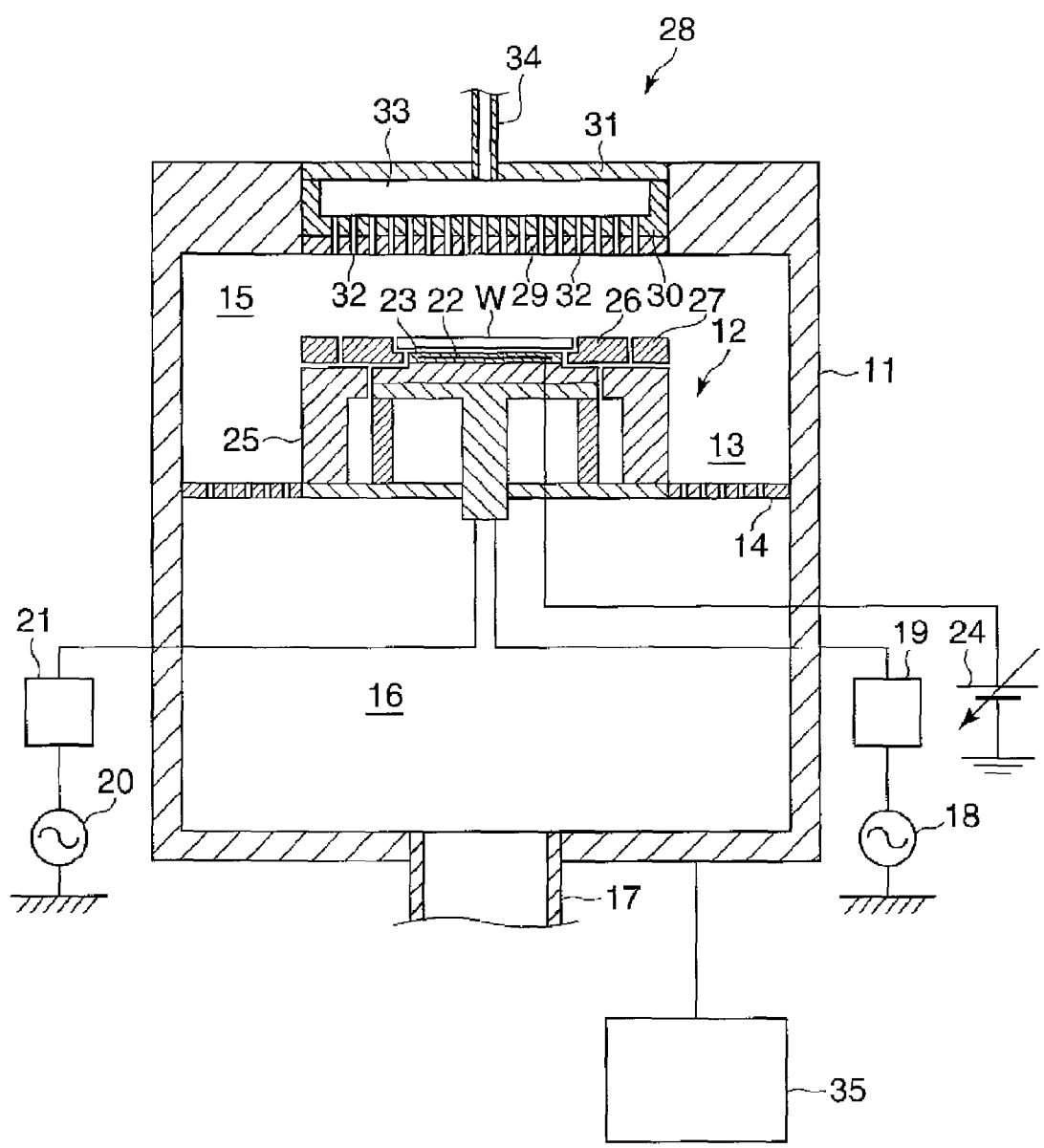
FIG. 1 is a cross-sectional view schematically illustrating a configuration of a substrate processing apparatus for performing a substrate processing method in accordance with an illustrative embodiment.

FIG. 1 is a cross-sectional view schematically illustrating a configuration of a substrate processing apparatus for performing a substrate processing method in accordance with an illustrative embodiment. In the substrate processing apparatus, a plasma etching process is performed on a semiconductor device wafer (substrate) in order to manufacture a magnetic storage device.

In FIG. 1, a substrate processing apparatus 10 includes a chamber 11 configured to accommodate therein a wafer W having a diameter of, e.g., about 300 mm, and a circular column-shaped susceptor 12 configured to mount thereon the wafer W is mounted within the chamber 11. In the substrate processing apparatus 10, a side exhaust path 13 is formed between an inner sidewall of the chamber 11 and a side surface of the susceptor 12. An exhaust plate 14 is mounted at a certain portion of the side exhaust path 13.

The exhaust plate 14 is a plate-shaped member having a multiple number of through holes and serves as a partition plate that divides the chamber 11 into an upper region and a lower region. As will be described later, plasma is generated in an inner space of the upper region 15 (hereinafter, referred to as "processing room") of the chamber 11. Further, an exhaust pipe 17 for exhausting a gas within the chamber 11 is connected to the lower region (hereinafter, referred to as "exhaust room (manifold)") of the chamber 11. The exhaust plate 14 confines or reflects the plasma generated within the processing room 15 so as to prevent leakage of the plasma into the manifold 16.

A TMP (Turbo Molecular Pump) and a DP (Dry Pump) (both not shown) are connected to the exhaust pipe 17, and these pumps evacuate and depressurize the inside of the chamber 11. To be specific, the DP depressurizes the inside of the chamber 11 to an intermediate vacuum state from an atmospheric pressure, and, in cooperation with the DP, the TMP further depressurizes the inside of the chamber 11 to a high vacuum state lower than the intermediate vacuum state. Further, an internal pressure of the chamber 11 is controlled by an APC valve (not shown).

A first high frequency power supply 18 is connected to the susceptor 12 within the chamber 11 via a first matching unit 19, and a second high frequency power supply is connected to the susceptor 12 via a second matching unit 21. The first high frequency power supply 18 applies a high frequency power of a relatively low frequency of, e.g., about 13 MHz, for ion attraction to the susceptor 12. The second high frequency power supply 20 applies a high frequency power of a relatively high frequency of, e.g., about 40 MHz, for plasma generation to the susceptor 12. Thus, the susceptor 12 serves as an electrode. Further, the first matching unit 19 and the second matching unit 21 reduce reflection of the high frequency powers from the susceptor 12, so that it is possible to maximize the efficiency of applying the high frequency powers to the susceptor 12.

A step-shaped portion is formed in an upper peripheral portion of the susceptor 12 such that a central portion of the susceptor 12 protrudes upward in the drawing. An electrostatic chuck 23, made of ceramics, having an electrostatic electrode plate 22 embedded therein is mounted on the central portion of the susceptor 12. The electrostatic electrode plate 22 is connected with a DC power supply 24. When a positive DC voltage is applied to the electrostatic electrode plate 22, a negative electric potential is generated on a bottom surface (hereinafter, referred to as "rear surface") of the wafer W facing the electrostatic chuck 23. As a result, an electric potential difference is generated between the electrostatic electrode plate 22 and the rear surface of the wafer W. The wafer W is attracted to and held on the electrostatic chuck 23 by a Coulomb force or a Johnsen-Rahbek force generated due to the electric potential difference.

The susceptor 12 includes therein a cooling unit (not shown) such as a coolant path. The cooling unit absorbs heat of the wafer W, of which a temperature can be increased by being contacted with plasma, via the susceptor 12. Therefore, it is possible to prevent the temperature of the wafer W from being increased higher than a desired level.

The susceptor 12 is made of a conductor such as aluminum in consideration of heat transfer efficiency and a function as an electrode. In order to prevent the conductor from being exposed to the processing room 15 where the plasma is generated, the side surface of the susceptor 12 is coated with a side surface protection member 25 made of a dielectric material such as quartz ($SiO_2$).

Further, a focus ring 26 is mounted on the step-shaped portion in the upper part of the susceptor 12 and the side surface protection member 25 so as to surround the wafer W held on the electrostatic chuck 23. Furthermore, a shield ring 27 is mounted on the side surface protection member 25 so as to surround the focusing ring 26. The focus ring 26 is made of silicon (Si) or silicon carbide (SiC), and the plasma is distributed above the wafer W and the focus ring 26.

A shower head 28 is mounted at a ceiling of the chamber 11 so as to face the susceptor 12. The shower head 28 includes an upper electrode plate 29; a cooling plate 30 configured to support the upper electrode plate 29 in a detachable manner; and a cover 31 for covering the cooling plate 30. The upper electrode plate 29 is configured as a circular plate-shaped member having a multiple number of gas holes 32 formed through the upper electrode plate 29 in a thickness direction thereof. A buffer room 33 is formed within the cooling plate 30 and connected to a processing gas inlet line 34. In the substrate processing apparatus 10, the shower head 28 and the susceptor 12 are positioned such that the upper electrode plate 29 is parallel to an upper surface of the susceptor 12.

The substrate processing apparatus 10 further includes a control unit 35. The control unit 35 controls an operation of each component according to a program stored in an internal memory so as to perform a plasma etching process. To be specific, the control unit 35 controls an operation of each component, so that a processing gas supplied to the buffer room 33 from the processing gas inlet line 34 is introduced to the inner space of the processing room 15; the introduced processing gas is excited into plasma with the high frequency power for plasma generation applied to the inner space of the processing room 15 from the second high frequency power supply 20 via the susceptor 12; cations of the plasma are attracted toward the wafer W with the high frequency power for ion attraction applied to the susceptor from the first high frequency power supply 18; and a plasma etching process is performed on the wafer W.

Figure 2:
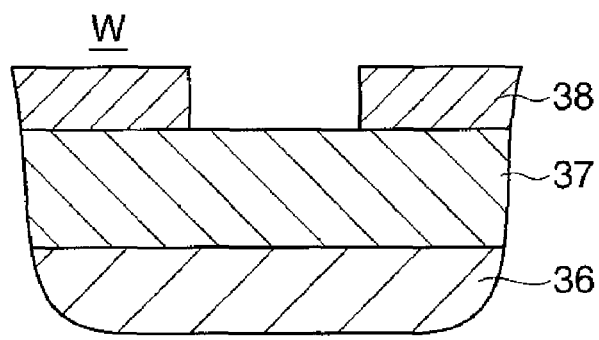
FIG. 2 is a partial cross-sectional view schematically illustrating a structure of a wafer on which a plasma etching process is performed by the substrate processing apparatus of FIG. 1.

FIG. 2 is a partial cross-sectional view schematically illustrating a structure of a wafer on which a plasma etching process is performed by the substrate processing apparatus of FIG. 1.

In FIG. 2, the wafer W includes a platinum-manganese layer 37 formed on a base 36 made of silicon; and a tantalum (Ta) layer 38 as a mask film formed on the platinum-manganese layer 37 and having an opening of a certain pattern.

In order to etch the platinum-manganese layer 37 containing platinum, which is a material difficult to be etched, the present inventors have investigated other methods than an ion milling process or an etching process using a halogen gas. That is, in the substrate processing apparatus 10, by using a carbon monoxide (CO) gas as a processing gas, the platinum is reduced by high reducibility of the carbon monoxide gas, as a result, the platinum can be removed from the platinum-manganese layer 37. Further, by bonding the carbon monoxide gas as a ligand to the platinum, metal carbonyls are generated, as a result, the platinum can be removed from the platinum-manganese layer 37. As described above, the present inventors have found out that when the platinum-manganese layer 37 is etched with the carbon monoxide gas, a carbon deposited layer is formed on the platinum-manganese layer 37 and on the tantalum layer 38 by carbon generated from the carbon monoxide gas. As a result, the etching process is stopped.

Thus, the present inventors make a close study and find out the followings. A great quantity of a hydrogen (H) gas is added to the processing gas in order to ash the carbon deposited layer, and a rare gas, e.g., an argon (Ar) gas, having dissociation property is added to the processing gas in order to maintain a plasma state within the inner space of the processing room 15. Then, a plasma etching process is performed on the wafer W by using the above processing gas in the substrate processing apparatus. As a result, it is possible to prevent the carbon deposited layer from being formed on the platinum-manganese layer 37 and on the tantalum layer 38 and also possible to etch the platinum-manganese layer 37. To be specific, when the platinum-manganese layer 37 is etched by using the processing gas containing the carbon monoxide gas, the hydrogen gas, and the argon gas, if a ratio of a gas flow rate of the hydrogen gas to a total gas flow rate of the carbon monoxide gas and the hydrogen gas is in a range of from about 50% to about 75%, the platinum-manganese layer 37 can be etched without forming the carbon deposited layer on the platinum-manganese layer 37. The illustrative embodiments are based on this finding.

It is difficult to clearly explain an etching mechanism of the platinum-manganese layer 37. However, even if a great amount of cations is generated by generating a great amount of plasma by increasing a dissociation degree of the processing gas containing the carbon monoxide gas, the hydrogen gas, and the argon gas, an etching rate of the platinum-manganese layer 37 is not much increased, a hole or a trench formed on the platinum-manganese layer 37 by etching the platinum-manganese layer 37 does not have a sidewall of a tapering shape, i.e., isotropic etching has been mainly performed instead of anisotropic etching. Based on the above, it is assumed that the platinum-manganese layer 37 is etched mainly by a chemical reaction and the present inventors find out an etching method to be explained below as the substrate processing method in accordance with the present illustrative embodiment.

Figure 3:
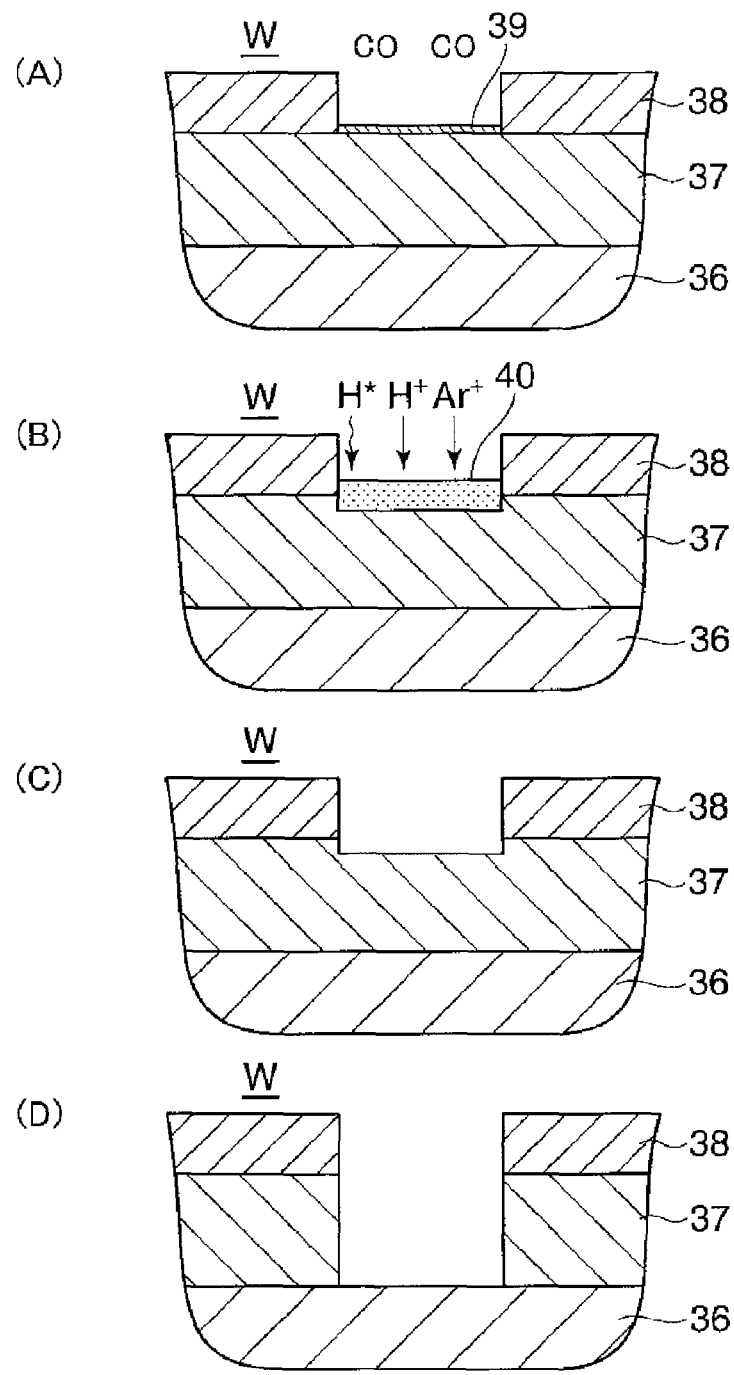
FIG. 3 is a process diagram illustrating an etching method as a substrate processing method in accordance with an illustrative embodiment.

FIG. 3 is a process diagram illustrating an etching method as the substrate processing method in accordance with the present illustrative embodiment.

First, the wafer W is attracted to and held on the susceptor 12 of the substrate processing apparatus 10 and, then, the inner space of the processing room 15 is depressurized. Then, the processing gas containing the carbon monoxide gas, the hydrogen gas, and the argon gas is introduced into the inner space. In the processing gas, a ratio of a gas flow rate of the hydrogen gas to the total gas flow rate of the carbon monoxide gas and the hydrogen gas is set to be in a range of from about 50% to about 75%.

Subsequently, the high frequency power for plasma generation is applied to the inner space of the processing room 15, and the high frequency power for ion attraction is applied to the susceptor 12. Here, a carbon deposited layer (a carbon layer) generated from the carbon monoxide gas is deposited on a surface of the platinum-manganese layer 37. Further, a carbon deposited layer (not shown) generated from the carbon monoxide gas is also deposited on a surface of the tantalum layer 38 (FIG. 3(A)). The argon gas in the processing gas is excited into argon plasma by the high frequency power for plasma generation. The argon plasma collides with hydrogen molecules of the hydrogen gas, so that the hydrogen gas is excited into hydrogen plasma. Cations and radicals of the hydrogen plasma come into contact with the carbon deposited layer 39, and the carbon deposited layer 39 is asked.

Further, cations of the argon plasma are projected to the carbon deposited layer 39 by the high frequency power for ion attraction and supplies energy into the carbon deposited layer 39. The carbon deposited layer 39 supplied with the energy is reacted with oxygen generated from the carbon monoxide gas, so that a carbonyl group is generated. Further, in the processing gas, the ratio of the gas flow rate of the hydrogen gas to the total gas flow rate of the carbon monoxide gas and the hydrogen gas is set to be in the range of from about 50% to about 75% and a great quantity of hydrogen exists. Thus, surplus hydrogen exists while the carbon deposited layer 39 is asked by the cations and radicals of the hydrogen plasma. The surplus hydrogen is reacted with the carbonyl group by the energy supplied into the carbon deposited layer 39, so that a carboxyl group (—COOH) is generated. This carboxyl group as a ligand is coordinate-bonded with the platinum of the platinum-manganese layer 37, so that an organic complex 40, for example, $Pt(COOH)_n$ is generated. As stated above, the platinum of the platinum-manganese layer 37 is used to generate the organic complex 40, and, thus, a part of the platinum-manganese layer 37 is changed into the organic complex 40 (FIG. 3(B)).

Generally, a saturated vapor pressure of an organic complex of metal is low. Therefore, the organic complex 40 is easy to vaporize. As a result, the part of the platinum-manganese layer 37 is etched (FIG. 3(C)).

Thereafter, if the processing gas containing the carbon monoxide gas, the hydrogen gas, and the argon gas is introduced and the high frequency power for plasma generation and the high frequency power for ion attraction are continuously applied, the processes depicted in FIGS. 3(A) to 3(C) are repeated. As a result, the platinum-manganese layer 37 can be removed (FIG. 3(D)).

According to the etching method depicted in FIG. 3, the platinum-manganese layer 37 is etched by using the processing gas containing the carbon monoxide gas, the hydrogen gas, and the argon gas and the ratio of the gas flow rate of the hydrogen gas to the total gas flow rate of the carbon monoxide gas and the hydrogen gas is set to be in the range of from about 50% to about 75%. Thus, while the carbon deposited layer 39 is asked, the carbonyl group is generated. The carbonyl group is combined with the surplus hydrogen so as to generate the carboxyl group. Then, the generated carboxyl group is coordinate-bonded with the platinum of the platinum-manganese layer 37 so as to generate the organic complex 40. The organic complex 40 can be easily vaporized. As a result, the platinum-manganese layer 37 can be etched without using a halogen gas.

According to the etching method depicted in FIG. 3, in the processing gas, the ratio of the gas flow rate of the hydrogen gas to the total gas flow rate of the carbon monoxide gas and the hydrogen gas is set to be in the range of from about 50% to about 75%. However, in order to prevent a sidewall of the hole or the trench from tapering, it is desirable to decrease the gas flow rate of the hydrogen gas and desirably, the ratio of the gas flow rate of the hydrogen gas to the total gas flow rate of the carbon monoxide gas and the hydrogen gas is in a range of from about 50% to about 60%. In this case, the gas flow rate of the hydrogen gas to the gas flow rate of the carbon monoxide gas is decreased, and, thus, deposition of a carbon deposited layer, generated from the carbon monoxide gas, on the tantalum layer 38 is strongly generated rather than etching of the tantalum layer 38 with the hydrogen plasma. As a result, damage of a pattern shape of the tantalum layer 38 caused by the etching can be suppressed, and, thus, it is possible to prevent the sidewall of the hole or the trench formed on the platinum-manganese layer 37 from tapering.

Further, according to the etching method of FIG. 3, in order to accelerate the generation of the carbonyl group and the carboxyl group, it is desirable to obtain a predetermined amount or more of the argon plasma supplying energy. Desirably, in the processing gas, a ratio of a gas flow rate of the argon gas to a total gas flow rate of the argon gas and the carbon monoxide gas is in a range of from about 40% to about 50%. In this case, cations of the argon plasma of the predetermined amount or more can supply sufficient energy into the carbon deposited layer 39. As a result, the generation of the carbonyl group is accelerated and further, the generation of the organic complex containing the platinum can be accelerated.

Furthermore, according to the etching method of FIG. 3, in order to firstly generate the carbonyl group, the carboxyl group, and the organic complex, it is desirable to set a pressure in the inner space of the processing room 15 to be about 13.3 Pa (about 100 mTorr) or more and etch the platinum-manganese layer 37. Typically, if an internal pressure of a processing chamber becomes larger than a certain level, sputtering by cations is suppressed. Thus, if the internal pressure of the processing room 15 is set to be about 13.3 Pa or more, it is possible to suppress sputtering by cations of plasma generated from the hydrogen gas and the argon gas. Therefore, it is possible to firstly make chemical reactions, i.e. generation of the carbonyl group, the carboxyl group, and the organic complex. In order to suppress the damage of the pattern shape of the tantalum layer 38, it is desirable to set the pressure of the internal pressure of the processing room 15 to be about 40.0 Pa (about 300 mTorr) or more and further suppress the sputtering by cations to thereby further suppress the etching of the tantalum layer 38. In order to accelerate vaporization of the organic complex 40, it is desirable to set the pressure of the inner space of the processing room to be as low as a certain level, specifically, to be about 133 Pa (about 1 Torr) or less.

The illustrative embodiments have been explained above, but the present disclosure is not limited thereto.

The above-described etching method of FIG. 3 is performed in the substrate processing apparatus 10. The etching method of FIG. 3 can be performed if the cations of the argon plasma generated from the argon gas supply energy into the carbon deposited layer 39 and the argon plasma collides with the hydrogen molecules of the hydrogen gas to excite the hydrogen gas into the hydrogen plasma. That is, if only the argon gas among the carbon monoxide gas, the hydrogen gas, and the argon gas is excited into plasma by the substrate processing apparatus 10, the etching method of FIG. 3 can be performed. Therefore, the etching method of FIG. 3 can be applied not only to a capacitively coupled plasma processing apparatus like the substrate processing apparatus 10 but also to a plasma processing apparatus capable of supplying a carbon monoxide gas and a hydrogen gas to a surface of a wafer W and projecting cations of argon plasma generated from an argon gas to the surface of the wafer W.

Figure 4:
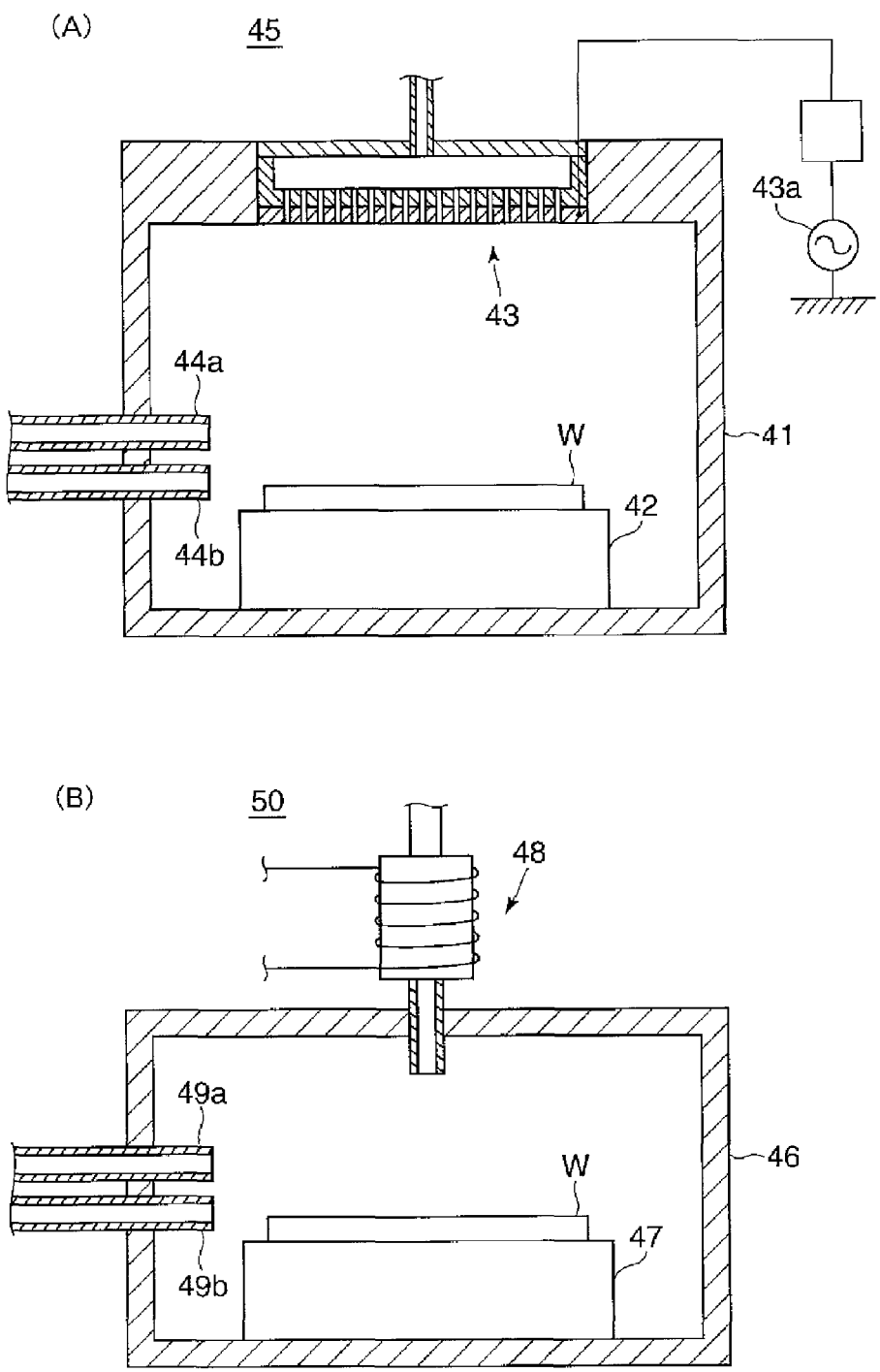
FIG. 4 provides cross-sectional views schematically illustrating configurations of modification examples of the substrate processing apparatus of FIG. 1, and to be specific.

By way of example, the etching method of FIG. 3 can be applied to a substrate processing apparatus 45 including a processing chamber 41; a mounting table 42 mounted in an inner space of the processing chamber 41; a shower head 43 positioned to face the mounting table 42 and configured to introduce a gas into the inner space of the processing chamber 41; a high frequency power supply 43a configured to apply a high frequency power for plasma generation to the shower head 43; two gas inlet lines 44a and 44b formed at a sidewall of the mounting table 42; and a high frequency power (not shown) configured to apply a high frequency power for ion attraction to the mounting table 42 as depicted in FIG. 4(A). Further, the etching method of FIG. 3 can be applied to a substrate processing apparatus 50 including a processing chamber 46; a mounting table 47 mounted in an inner space of the processing chamber 46; a plasma inlet line 48 positioned to face the mounting table 47 and configured to introduce plasma into the inner space of the processing chamber 46; two gas inlet lines 49a and 49b formed at a sidewall of the mounting table 47; and a high frequency power (not shown) configured to apply a high frequency power for ion attraction to the mounting table 47 as depicted in FIG. 4(B).

In the substrate processing apparatus 45, a wafer W is mounted on the mounting table 42, and then, the inner space of the processing chamber 41 is depressurized. An argon gas is introduced through the shower head 43 into the inner space of the processing chamber 41. The introduced argon gas is excited into argon plasma by the high frequency power for plasma generation applied to the inner space of the processing chamber 41 through the shower head 43. Cations of the argon plasma are projected to the wafer W mounted on the mounting table 42 by the high frequency power for ion attraction. In the meantime, a carbon monoxide gas and a hydrogen gas are supplied to a vicinity of a surface of the wafer W from the two gas inlet lines 44a and 44b, respectively.

In the substrate processing apparatus 50, a wafer W is mounted on the mounting table 47, and then, the inner space of the processing chamber 46 is depressurized. Plasma of an argon gas is introduced through the plasma inlet line into the inner space of the processing chamber 46. Cations of the introduced argon plasma are projected to the wafer W mounted on the mounting table 47 by the high frequency power for ion attraction. In the meantime, a carbon monoxide gas and a hydrogen gas are supplied to a vicinity of a surface of the wafer W from the two gas inlet lines 49a and 49b, respectively.

In both the substrate processing apparatus 45 and the substrate processing apparatus 50, the cations of the argon plasma reaching the surface of the wafer W supply energy into the carbon deposited layer 39 generated from the carbon monoxide gas and formed on the surface of the platinum-manganese layer 37, and collide with hydrogen molecules of the hydrogen gas so as to excite the hydrogen gas into hydrogen plasma. As a result, the carbonyl group, the carboxyl group, and the organic complex 40 can be generated and the platinum-manganese layer 37 can be etched. Further, in both the substrate processing apparatus 45 and the substrate processing apparatus 50, a ratio of a gas flow rate of the hydrogen gas to the total gas flow rate of the carbon monoxide gas and the hydrogen gas is set to be in a range of from about 50% to about 75%.

Figure 5:
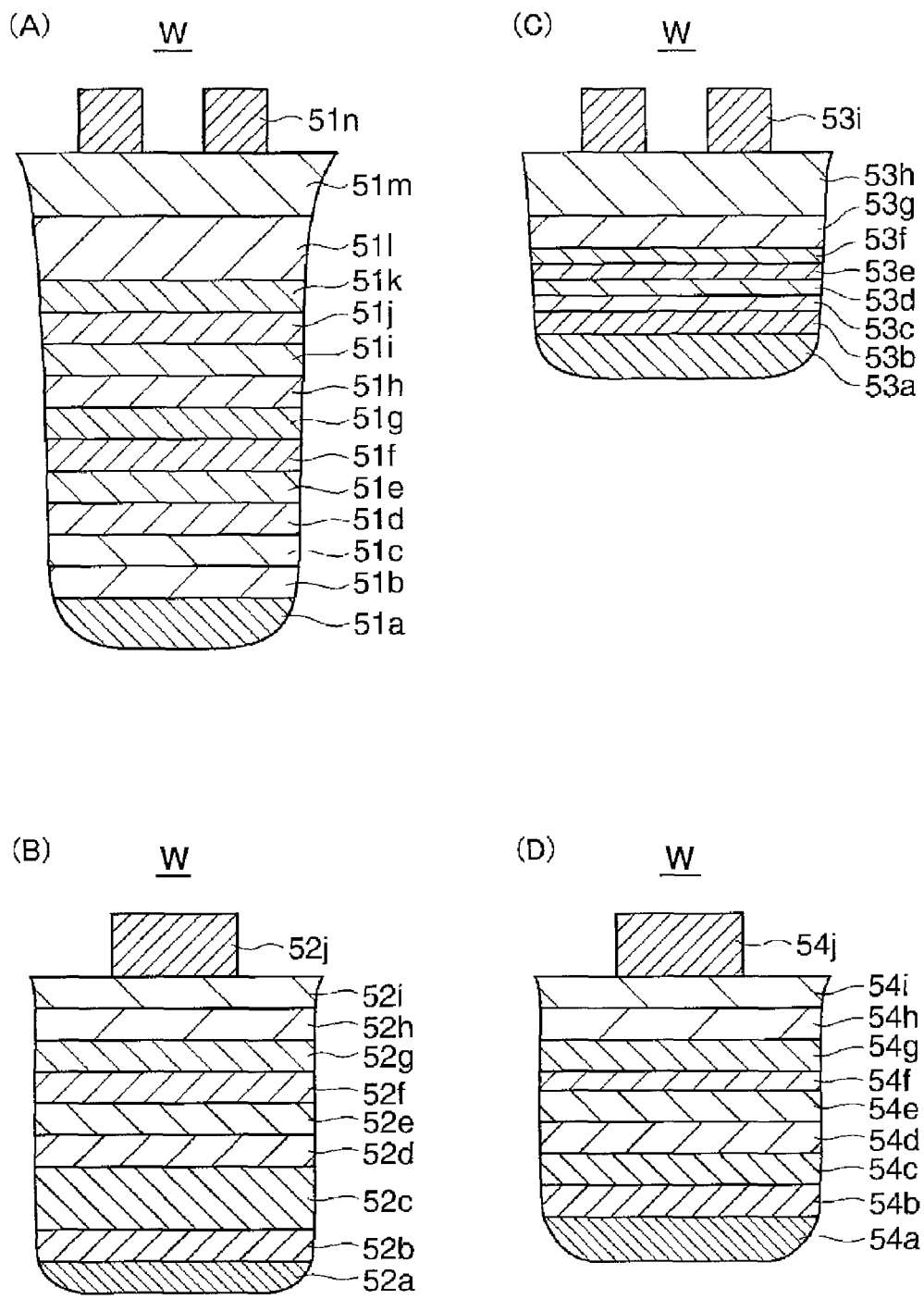
FIG. 5 provides partial cross-sectional views schematically illustrating structures of modification examples of a wafer on which the etching method of FIG. 3 is performed, and to be specific.

A layered structure of the wafer W to which the etching method of FIG. 3 is applied is not limited to a structure as depicted in FIG. 2. By way of example, a layered structure (FIG. 5(A)) in which a tantalum layer 51b, a platinum-manganese layer 51c, a cobalt-iron (CoFe) layer 51d, a ruthenium (Ru) layer 51e, a cobalt-iron layer 51f, an insulating layer 51g made of magnesia (MgO) or alumina ($Al_2O_3$), a nickel-iron (NiFe) layer 51h, a ruthenium layer 51i, a nickel-iron layer 51j, a ruthenium layer 51k, a tantalum layer 51l, a bottom anti-reflection coating layer (a BARC layer) 51m, and a photoresist layer 51n having a predetermined pattern shape are formed on a base 51a made of silicon in sequence from the bottom. Further, the etching method of FIG. 3 can be applied to a layered structure (FIG. 5(B)) in which a nickel-iron layer 52b, a platinum-manganese layer 52c, a cobalt-iron layer 52d, a ruthenium layer 52e, a cobalt-iron layer 52f, a barrier layer 52g made of alumina ($Al_2O_3$), a nickel-iron layer 52h, a tantalum layer 52i, and a photoresist layer 52j having a predetermined pattern shape are formed on a base wiring 52a made of copper in sequence from the bottom. Moreover, the etching method of FIG. 3 can be applied to a layered structure (FIG. 5(C)) in which a tantalum layer 53b, a platinum-manganese layer 53c, a cobalt-iron layer 53d, an alumina layer 53e, a cobalt-iron layer 53f, a titanium nitride layer 53g, a silicon dioxide layer 53h, and a photoresist layer 53i having a predetermined pattern shape are formed on an insulating film 53a in sequence from the bottom. Furthermore, the etching method of FIG. 3 can be applied to a layered structure (FIG. 5(D)) in which a tantalum layer 54b, an aluminum layer 54c, a tantalum layer 54d, a nickel-iron/platinum-manganese layer 54e, an alumina layer 54f, a cobalt-iron layer 54g, a nickel-iron layer 54h, a tantalum layer 54i, and a photoresist layer 54j having a predetermined pattern shape are formed on a base 54a made of silicon in sequence from the bottom.

A layer to be etched by the etching method of FIG. 3 is not limited to the platinum-manganese layer, and may be a platinum layer containing only platinum or a layer containing platinum and other metals. Further, in the etching method of FIG. 3, the processing gas contains the carbon monoxide gas, the hydrogen gas, and the argon gas. However, the argon gas may be substituted with another rare gas.

It is to be understood that the object of the present disclosure can also be achieved by supplying to a computer or the like a storage medium storing therein a software program for executing the functions of the embodiments described above, and then by reading and executing the program stored in the storage medium by a CPU of the computer.

In this case, the program read from the storage medium may implement the functions of each embodiment described above. Accordingly, the program and the storage medium storing therein the program may constitute the present disclosure.

Moreover, the storage medium for storing the program may include such as a RAM, a NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, or a DVD+RW), a magnetic tape, a non-volatile memory card, or a ROM, which can memorize the program. Alternatively, the program may be supplied to the computer by downloading it from another computer or database, or a computer (not shown) connected to the Internet, a commercial network, a local area network (LAN) or the like. an other non-illustrated computer and a data base Further, when the CPU of the computer executes the retrieved program, the above-described functions of the illustrative embodiments are carried out and also, all or part of a process is performed by an operating system (OS) executed in the CPU based on an instruction of the program. The above-described functions of the illustrative embodiments can be carried out by this process.

Furthermore, it is to be understood that the program read from the storage medium may be written in a function extension board inserted into the computer or a function extension unit connected to the computer, and a CPU of the function extension board or the function extension unit may perform a part or all of the actual process in response to instructions of the program and the function of each embodiment may be implemented by the process.

The program may include an object code, a program executable by an interpreter, script data provided to an OS or the like.

Experimental Example

Hereinafter, an experimental example will be explained.

In an experimental example 1, the wafer W depicted in FIG. 2 is attracted to and held on the susceptor 12 within the substrate processing apparatus 10, and a pressure of the inner space of the processing room 15 is set to about 13.3 Pa. Then, a processing gas is introduced into the inner space. A ratio of gas flow rates of the hydrogen gas:the argon gas:the carbon monoxide gas in the processing gas is set to be about 150 sccm:100 sccm:150 sccm. That is, a ratio of the gas flow rate of the hydrogen gas to the total gas flow rate of the carbon monoxide gas and the hydrogen gas is about 50%, and a ratio of the gas flow rate of the argon gas to the total gas flow rate of the argon gas and the carbon monoxide gas is about 40%.

Then, a high frequency power of about 300 W for plasma generation is applied to the inner space of the processing room 15, and a high frequency power of about 600 W for ion attraction is applied to the susceptor 12 to etch the platinum-manganese layer 37 for about 600 seconds. Thereafter, a status of a trench formed in the platinum-manganese layer 37 is checked. The carbon deposited layer 39 hardly remains on each surface of the trench, and the trench hardly has a sidewall of a tapering shape.

In an experimental example 2, the platinum-manganese layer 37 is etched on the same conditions as in the experimental example 1 except a gas flow rate ratio of the processing gas. In the experimental example 2, a ratio of gas flow rates of the hydrogen gas:the argon gas:the carbon monoxide gas in the processing gas is set to be about 300 sccm:100 sccm:100 sccm. That is, a ratio of the gas flow rate of the hydrogen gas to the total gas flow rate of the carbon monoxide gas and the hydrogen gas is about 75% and a ratio of the gas flow rate of the argon gas to the total gas flow rate of the argon gas and the carbon monoxide gas is about 50%.

After the platinum-manganese layer 37 is etched, a status of a trench formed in the platinum-manganese layer 37 is checked. It is found that the carbon deposited layer 39 does not remain on each surface of the trench at all, and with respect to a vertical line on the surface of the wafer W, a taper angle (an angle inclined to the vertical line) formed by both surfaces of the trench is about 10°. This taper angle is within a tolerance range.

In a comparative example, the platinum-manganese layer 37 is etched on the same conditions as in the experimental example 1 except a gas flow rate ratio of the processing gas. In the comparative example, a ratio of gas flow rates of the hydrogen gas:the argon gas:the carbon monoxide gas in the processing gas is about 100 sccm:100 sccm:300 sccm. That is, a ratio of the gas flow rate of the hydrogen gas to the total gas flow rate of the carbon monoxide gas and the hydrogen gas is about 25%, and a ratio of the gas flow rate of the argon gas to the total gas flow rate of the argon gas and the carbon monoxide gas is about 25%.

After the platinum-manganese layer 37 is etched, a status of a trench formed in the platinum-manganese layer 37 is checked. It is found that the carbon deposited layer 39 is thickly formed on each surface of the trench, and each surface of the trench is not exposed and also, a depth of the trench is smaller than those of the trenches formed in the experimental examples 1 and 2. This may be because that the gas flow rate of the argon gas of the processing gas in the comparative example is smaller than those of the experimental examples 1 and 2, cations of plasma generated from the argon gas cannot supply sufficient energy into the carbon deposited layer 39, and the carbon deposited layer 39 cannot be changed into a carbonyl group. Further, this may be because that the gas flow rate of the hydrogen gas of the processing gas in the comparative example is smaller than those of the experimental examples 1 and 2, there is no surplus hydrogen so that a carboxyl group is not generated and the organic complex 40 is not generated by coordinate-bonding the carboxyl group as a ligand with platinum of the platinum-manganese layer 37.

From the above-described findings, it can be seen that in order not to deposit the carbon deposited layer 39 on each surface of the platinum-manganese layer 37 and in order to sufficiently etch the platinum-manganese layer 37, a ratio of the gas flow rate of the argon gas to the total gas flow rate of the argon gas and the carbon monoxide gas needs to be about 40% or more, and a ratio of the gas flow rate of the hydrogen gas to the total gas flow rate of the carbon monoxide gas and the hydrogen gas needs to be about 50% or more.

From the experimental example 2, if a ratio of the gas flow rate of the hydrogen gas to the total gas flow rate of the carbon monoxide gas and the hydrogen gas is set to be more than about 75%, the tantalum layer 38 may be strongly etched by hydrogen plasma and the pattern shape of the tantalum layer 38 may be damaged, and, thus, the taper angle formed by the both surfaces of the trench can be increased. Therefore, it may be desirable to set the ratio of the gas flow rate of the hydrogen gas to the total gas flow rate of the carbon monoxide gas and the hydrogen gas in the processing gas to about 75% or less.

From the experimental example 2, if a ratio of the gas flow rate of the argon gas to the total gas flow rate of the argon gas and the carbon monoxide gas is set to be more than about 50%, sputtering by cations of argon plasma may be strongly performed, and the pattern shape of the tantalum layer 38 may be damaged, and, thus, the taper angle formed by the both surfaces of the trench can be increased. Therefore, it may be desirable to set the ratio of the gas flow rate of the argon gas to the total gas flow rate of the argon gas and the carbon monoxide gas in the processing gas to about 50% or less.

What is claimed is:

1. A substrate processing method for etching a layer, containing, at least, platinum, formed on a substrate by using a mask film, the substrate processing method comprising:

etching the layer containing, at least, platinum by using a processing gas containing, at least, a carbon monoxide gas, a hydrogen gas, and a rare gas, wherein a ratio of a gas flow rate of the hydrogen gas to a total gas flow rate of the carbon monoxide gas and the hydrogen gas is in a range of from about 0.5 to about 0.75, and the layer containing, at least, platinum is etched without using a halogen gas.

2. The substrate processing method of claim 1, wherein the ratio of the gas flow rate of the hydrogen gas to the total gas flow rate of the carbon monoxide gas and the hydrogen gas is in a range of from about 0.5 to about 0.6.

3. The substrate processing method of claim 1, wherein a ratio of a gas flow rate of the rare gas to a total gas flow rate of the rare gas and the carbon monoxide gas is in a range of from about 0.4 to about 0.5.

4. The substrate processing method of claim 1, wherein the rare gas includes an argon gas.

5. The substrate processing method of claim 1, wherein the etching the layer containing, at least, platinum is performed at a pressure in a range of from about 13.3 Pa (about 100 mTorr) to about 133 Pa (about 1 Torr).

6. The substrate processing method of claim 5, wherein the etching the layer containing, at least, platinum is performed at a pressure in a range of from about 40.0 Pa (about 300 mTorr) to about 133 Pa (about 1 Torr).

* * * * *

UNITED STATES PATENT AND TRADEMARK OFFICE
CERTIFICATE OF CORRECTION

PATENT NO. : 8,715,520 B2  
APPLICATION NO. : 13/425551  
DATED : May 6, 2014  
INVENTOR(S) : Takashi Sone et al.

Page 1 of 1

It is certified that error appears in the above-identified patent and that said Letters Patent is hereby corrected as shown below:

In the Specification

Column 4, line 6, please add - 20 - between "supply" and "is"

Column 5, line 16, please add - 12 - between "susceptor" and "from"

Column 8, line 8, please add - 15 - between "room" and "to"

Signed and Sealed this  
Ninth Day of September, 2014

Michelle K. Lee  
*Deputy Director of the United States Patent and Trademark Office*